United States Patent [19]
Saito et al.

[11] Patent Number: 5,634,805
[45] Date of Patent: Jun. 3, 1997

[54] CARD RECEIVING AND EJECTING DEVICE

[75] Inventors: Asao Saito, Tokorozawa; Toshiaki Uchida, Sayama; Shigeki Nozawa, Haga-machi, all of Japan

[73] Assignee: Citizen Watch Co., Ltd., Tokyo, Japan

[21] Appl. No.: 523,599

[22] Filed: Sep. 5, 1995

[30] Foreign Application Priority Data

Sep. 5, 1994 [JP] Japan ................................. 6-235900

[51] Int. Cl.⁶ ................................................. H01R 13/52
[52] U.S. Cl. ........................................ 439/159; 439/541.5
[58] Field of Search ................................. 439/159, 160, 439/541.5

[56] References Cited

U.S. PATENT DOCUMENTS

| | | | |
|---|---|---|---|
| 4,952,161 | 8/1990 | Komatsu | 439/159 |
| 5,026,296 | 6/1991 | Hashigushi | 439/159 |
| 5,115,376 | 5/1992 | Nakajima | 439/160 |
| 5,149,276 | 9/1992 | Dixon | 439/159 |
| 5,299,089 | 3/1994 | Lwee | 439/541.5 |
| 5,316,488 | 5/1994 | Gardner et al. | 439/541.5 |
| 5,324,204 | 6/1994 | Lwee | 439/541.5 |
| 5,364,275 | 11/1994 | Ota et al. | 439/541.5 |
| 5,466,166 | 11/1995 | Law et al. | 439/159 |
| 5,490,792 | 2/1996 | Sugita | 439/160 |

FOREIGN PATENT DOCUMENTS

| | | |
|---|---|---|
| 3-208112 | 9/1991 | Japan . |
| 4-3214 | 1/1992 | Japan . |

*Primary Examiner*—Neil Abrams
*Assistant Examiner*—Brian J. Biggi
*Attorney, Agent, or Firm*—Lowe, Price, LeBlanc & Becker

[57] ABSTRACT

A card receiving/ejecting device having an excellent operability and free from malfunction. First and second card receiving/ejecting units are vertically arranged adjacent to each other for accepting first and second expansion cards, respectively, for expanding a function of an information processing equipment. First and second ejection buttons are vertically arranged adjacent to each other at the side of openings formed in a housing. The first ejection button is directly connected to a first ejection lever, while the second ejection button is connected to a second ejection lever via an intervening spring which has a smaller elasticity than that of a second spring for urging the second ejection lever in a card inserting direction.

5 Claims, 5 Drawing Sheets

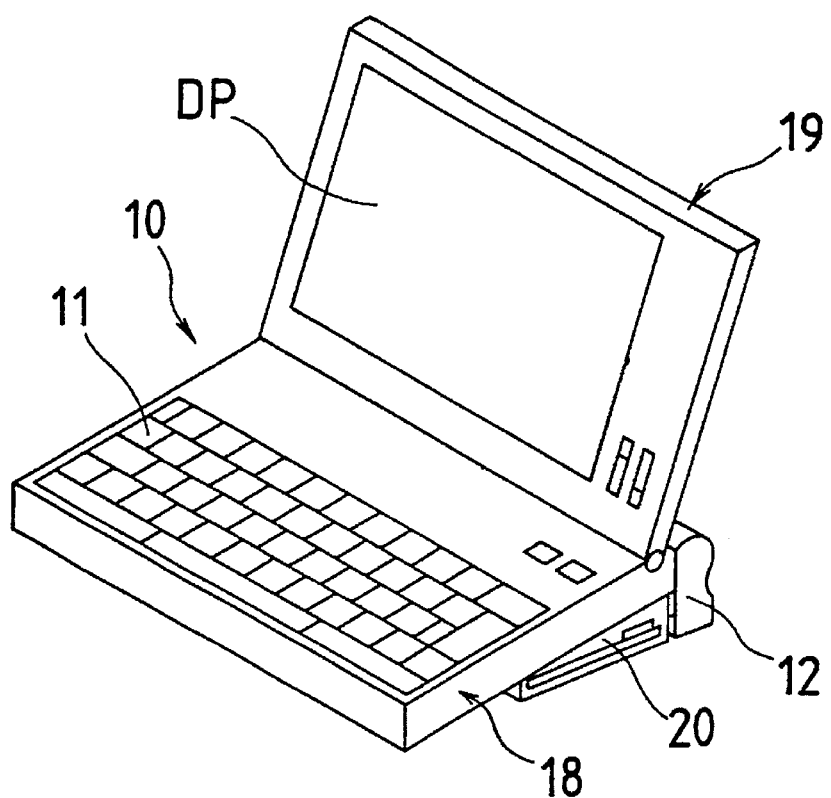
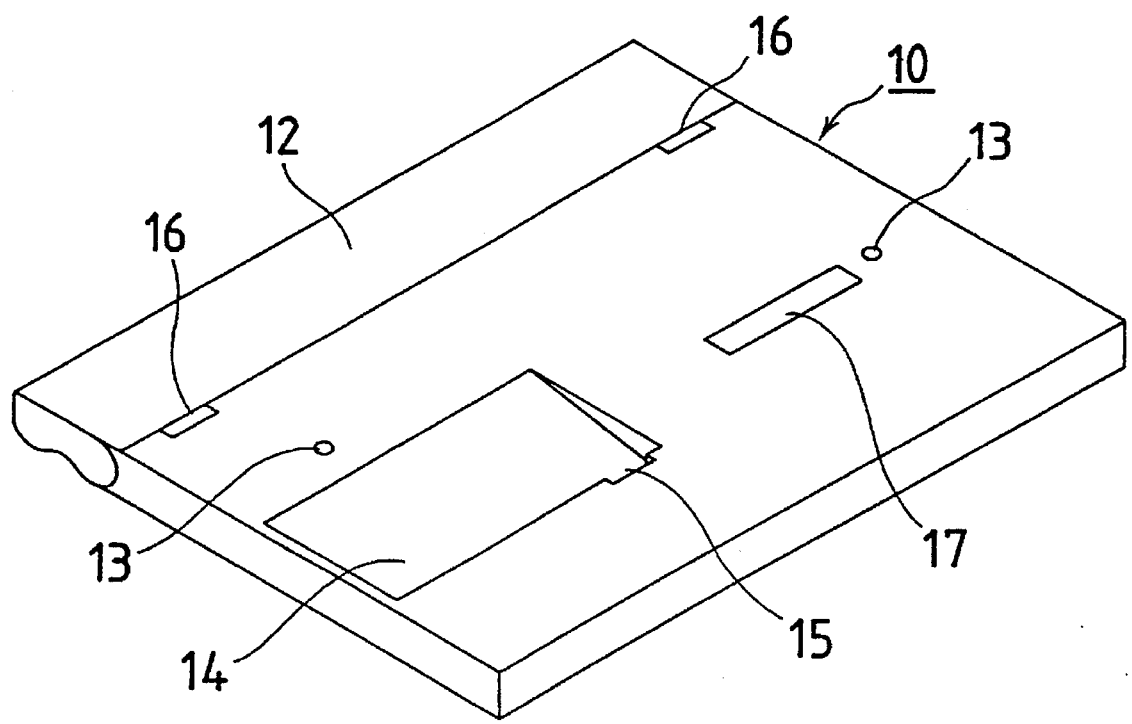

CARD RECEIVING AND EJECTING DEVICE

BACKGROUND OF THE INVENTION

1. Field of the Invention

The present invention relates to a card receiving and ejecting device for information processing equipment, such as a computer or a word processor, or for a peripheral device.

2. Description of Related Art

Two kinds of structure are known for connecting information processing equipment, such as a computer or a word processor, with a peripheral device. In the first structure, as shown in FIG. 9 of the accompanying drawings, the peripheral device 2 is disposed under the information processing equipment 1 and they are connected to each other via a cable or directly by a connector. In the second structure, as shown in FIG. 10, the peripheral apparatus 2 is disposed around the information processing equipment 1 and they are connected to each other by a cable 3 and a connector. In FIGS. 9 and 10, reference numeral 4 designates a keyboard. These known connecting structures are disclosed, for example, in Japanese Patent Laid-Open Publication Nos. Heisei 3-208112 and 4-8214.

The information processing equipment or peripheral device is provided with a card receiving/ejecting device for accepting an expansion card for expanding the function of the information processing equipment. In the case of providing the information processing equipment with two card receiving/ejecting devices, in general, two slots 5A and 5B into which the expansion cards are inserted are vertically arranged adjacent to each other as shown in FIG. 9. When the peripheral device 2 is of small size or thin type, two ejection buttons 6A and 6B for the slots 5A and 5B are also vertically arranged adjacent to each other beside the openings.

Peripheral devices of small-size or thin-type are strongly demanded for information processing equipments. In the case of vertically arranging the two ejection buttons 6A and 6B adjacent to each other, the ejection buttons 6A and 6B should be made thin and arranged close to each other so as to meet the demand of making the peripheral apparatus 2 small and thin in view of the fact that the thickness of each PCMCIA card slot 5A and 5B is only around 5 mm. Because the ejection buttons 6A and 6B are made thin and closely arranged, it is difficult to obtain good operability.

When an operator intends to press one ejection button, the other ejection button may possibly be pressed by mistake. Specifically since the upper ejection button 6A is positioned between the information processing equipment 1 and the lower ejection button 6B, the operability of the upper ejection button 6A would be poor and the lower ejection button 6B tends to be pressed by error. On the other hand, the lower ejection button 6B is easily pressed by lifting the peripheral apparatus 2 together with the information processing equipment 1.

SUMMARY OF THE INVENTION

It is an object of the present invention to provide a card receiving and ejecting device for an information processing equipment such as a computer or a word processor, having an excellent operability and free from malfunction.

A card receiving/ejecting device according to the invention comprises: a first card receiving/ejecting unit having a first card slot for accepting a first expansion card, and a first card ejecting mechanism for ejecting the first expansion card from the first card slot, said first card slot having at an innermost recess thereof a first connector for electrically connecting the first expansion card with the information processing equipment, and said first card ejecting mechanism having a first ejection lever for removing the first expansion card from the first connector, a first ejection button for operating the first ejection lever, a first connecting rod for operatively connecting the first ejection lever with the first ejection button, and a first ejection spring for elastically urging the first ejection button in a direction opposite to a pushing direction of the first ejection lever; a second card receiving/ejecting unit having a second card slot for accepting a second expansion card, and a second card ejecting mechanism for ejecting the second expansion card from the second card slot, said second card slot having at an innermost recess thereof a second connector for electrically connecting the second expansion card with the information processing equipment, and said second card ejecting mechanism having a second ejection lever for removing the second expansion card from the second connector, a second ejection button for operating the second ejection lever, a second connecting rod for operatively connecting the second ejection lever with the second ejection button, and a second ejection spring for elastically urging the second ejection lever in an inserting direction of the second expansion card; and a housing having an opening, through which the first and second expansion cards are inserted, for accommodating the first and second receiving/ejecting units. The first and second receiving/ejecting units are vertically arranged adjacent to each other and the first and second ejection buttons are vertically arranged adjacent to each other at the side of the opening of the housing. The first ejection button is directly connected to the first connecting rod, and the second ejection button is connected to the second connecting rod via an intervening spring having a smaller elasticity than that of the second ejection spring.

An operation stroke of the intervening spring is set so that the first expansion card is ejected from the first card receiving/ejecting unit when the first and second ejection buttons are pressed simultaneously, and the second expansion card is ejected from the second card receiving/ejecting unit when the first and second ejection buttons are further pressed simultaneously. The intervening spring may comprise a coil spring.

BRIEF DESCRIPTION OF THE DRAWINGS

FIG. 1 is a perspective view of an information processing equipment with a peripheral device connected thereto;

FIG. 2 is a perspective view showing a bottom side of the information processing equipment of FIG. 1;

DETAILED DESCRIPTION OF THE PREFERRED EMBODIMENT

Figure 3:
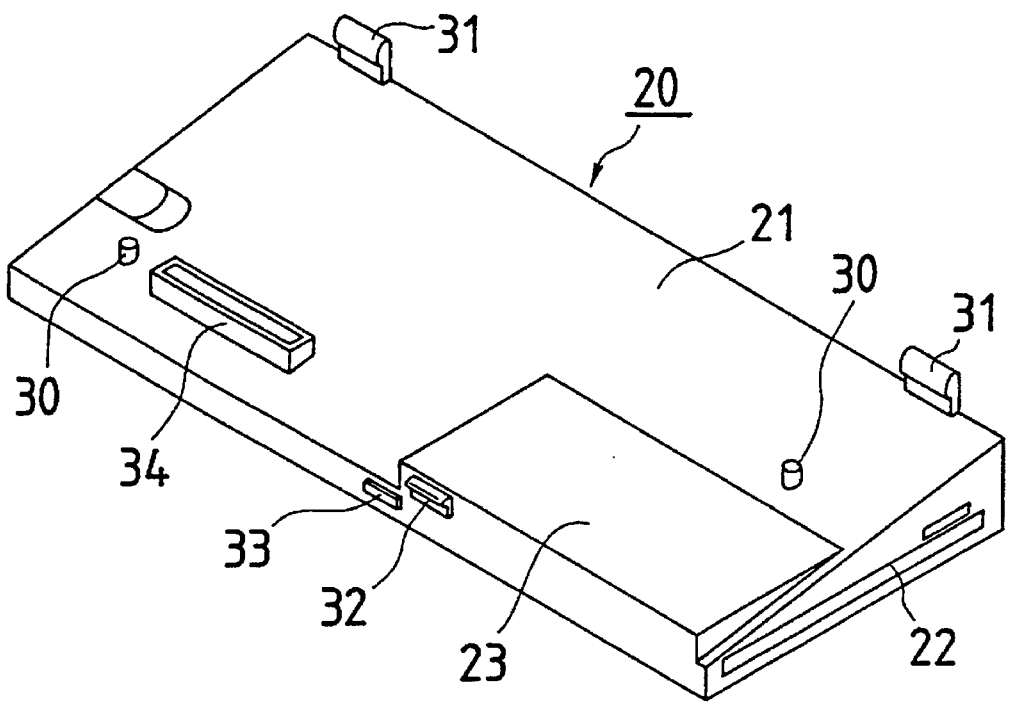
FIG. 3 is a perspective view of the peripheral device of FIG. 1 as seen from the top right.
Figure 4:
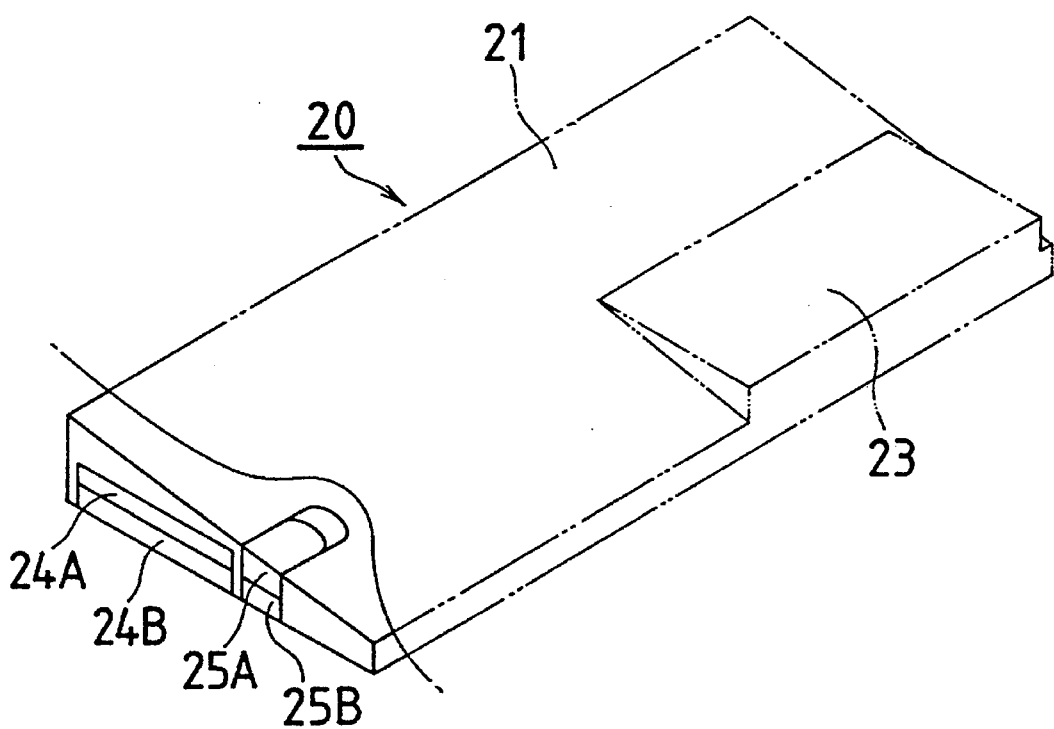
FIG. 4 is a perspective view of the peripheral device of FIG. 1 as seen from the top left.

As shown in FIGS. 1, 3 and 4, a housing 21 of an expansion unit 20 is disposed to lay on the bottom of an information processing equipment 10 and has a wedge shape with an upper surface sloping down to the front edge and. The housing 21 accommodates at the right side thereof a non-illustrated floppy disc drive (FDD) as an external storage device. At the right side of the housing 21, a door 22 is provided for inserting a floppy disc into the FDD. Since the extension unit 20 is formed to be a wedge shape with its height gradually reducing toward the front edge, it has a little space for accommodating the FDD. A projection 23 for FDD is formed by projecting the front side of the housing 21 to build in the FDD. At a left side of the housing 21, two slots are vertically arranged adjacent to each other for receiving expansion cards to be inserted. The two slots are provided with pivotally movable first and second doors 24A and 24B, respectively. Beside the first and second doors 24A and 24B, first and second ejection buttons 25A and 25B are vertically arranged adjacent to each other for ejecting the expansion cards inserted through the first and second doors 24A and 24B.

The housing 21 has two positioning pins 30 on the upper surface, two hooks 31 on the back side, a latch 32 on a front side of the projection 23 and a latch release knob 33 in the vicinity of the latch 32. A connector 34 is provided in the expansion unit 20 to project from an upper surface of the housing 21.

As shown in FIG. 1, the information processing equipment 10 comprises a main body 18 having a keyboard 11, and a lid member 19 having a display DP and pivotally mounted to the main body 18 by a hinge. On a rear end of the main body 18, a leg 12 is pivotally mounted for inclining the keyboard 11. The leg 12 may serve as a battery case for accommodating a battery. By making the legs 12 stand, the expansion unit 20 can be placed in a triangular space formed between the information processing equipment 10 and a desk top.

As shown in FIG. 2, on a bottom surface of the information processing equipment 10, positioning holes 13 are formed for receiving the corresponding positioning projections 30 of the expansion unit 20. Also, on the bottom surface of the information processing equipment 10, an escape recess 14 is formed for receiving the projection 23 of the expansion unit 20, and in the escape recess 14 a latch hole 15 is provided to be engaged with the latch 32 of the expansion unit 20. At a rear side of the main body 18, cutouts 16 are formed to be engaged with the corresponding hooks 31 of the expansion unit 20. On the main body 18, there is also provided a connector hole 17 for receiving the connector 34 of the expansion unit 20. In the connector hole 17, a non-illustrated connector is built in for an electric connection with the connector 34.

Hereinafter described is a way of connecting the expansion unit 20 with the information processing equipment 10. The expansion unit 20 is put on the information processing equipment 10 so that the positioning pins 30 are aligned with the positioning holes 13 and are inserted thereto. Then, the connector 34 of the expansion unit 20 is connected with the built-in connector of the information processing equipment 10 through the connector hole 17, and the projection 23 of the expansion unit 20 is accepted in the escape recess 14 of the information processing equipment 10, so that the inclined upper surface of the expansion unit comes into contact with the bottom surface of the information processing equipment 10. At that time, the hooks 31 and the latch 32 of the expansion unit 20 are engaged with the hook holes 16 and the latch hole 15, respectively, of the information processing equipment 10 to join the expansion unit 20 with the information processing equipment 10. As shown in FIG. 1, by standing the leg 12 of the information processing equipment 10, the expansion unit 20 is placed in the wedge-shape space defined between the information processing equipment 10 and the desk top.

Because of the wedge shape of the expansion unit 20, the front side of the information processing equipment, i.e., the front of the keyboard 11 does not become high when the expansion unit 20 is put on the bottom of the information processing equipment 10. Therefore, the operability of the keyboard is not deteriorated, but rather the keyboard 11 is inclined to improve the operability of the keyboard. In the above embodiment, the information processing equipment 10 is provided with the leg 12, which can be omitted. It is, however, preferable to provide the leg 12 to stabilize the information processing equipment 10.

Figure 5:
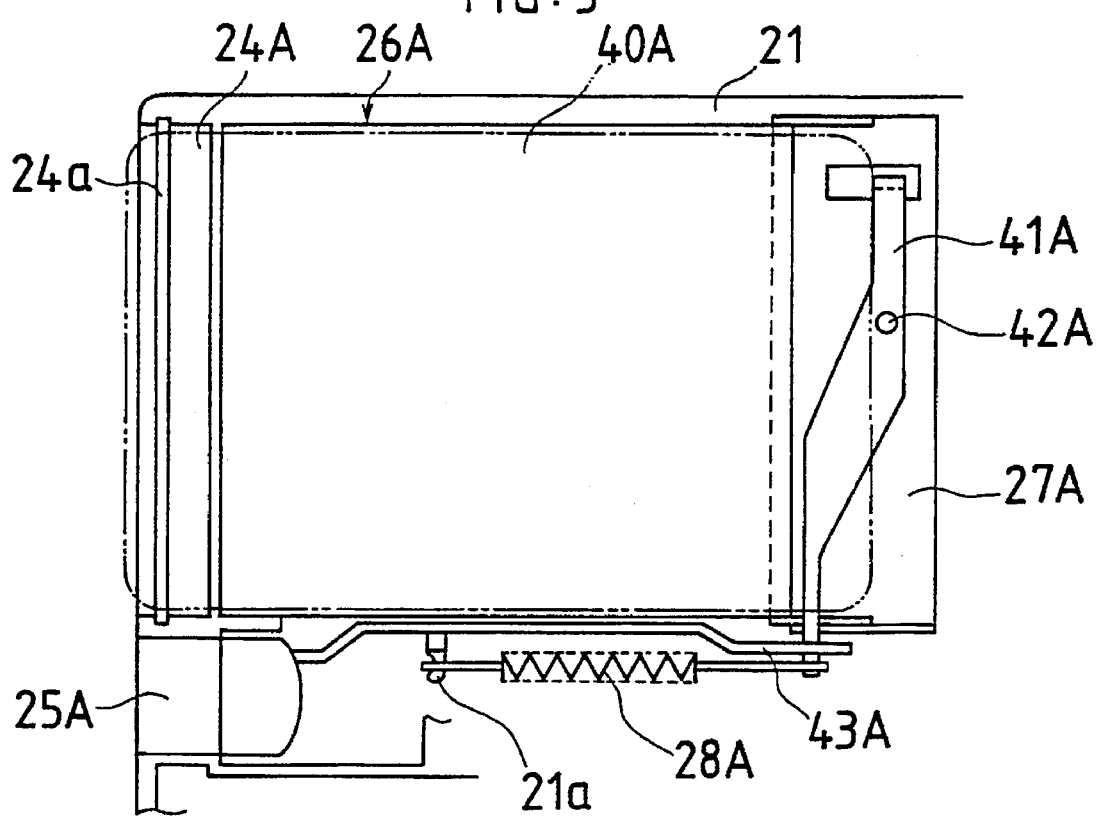
FIG. 5 is a plan view showing an ejecting mechanism for a first card slot.
Figure 6:
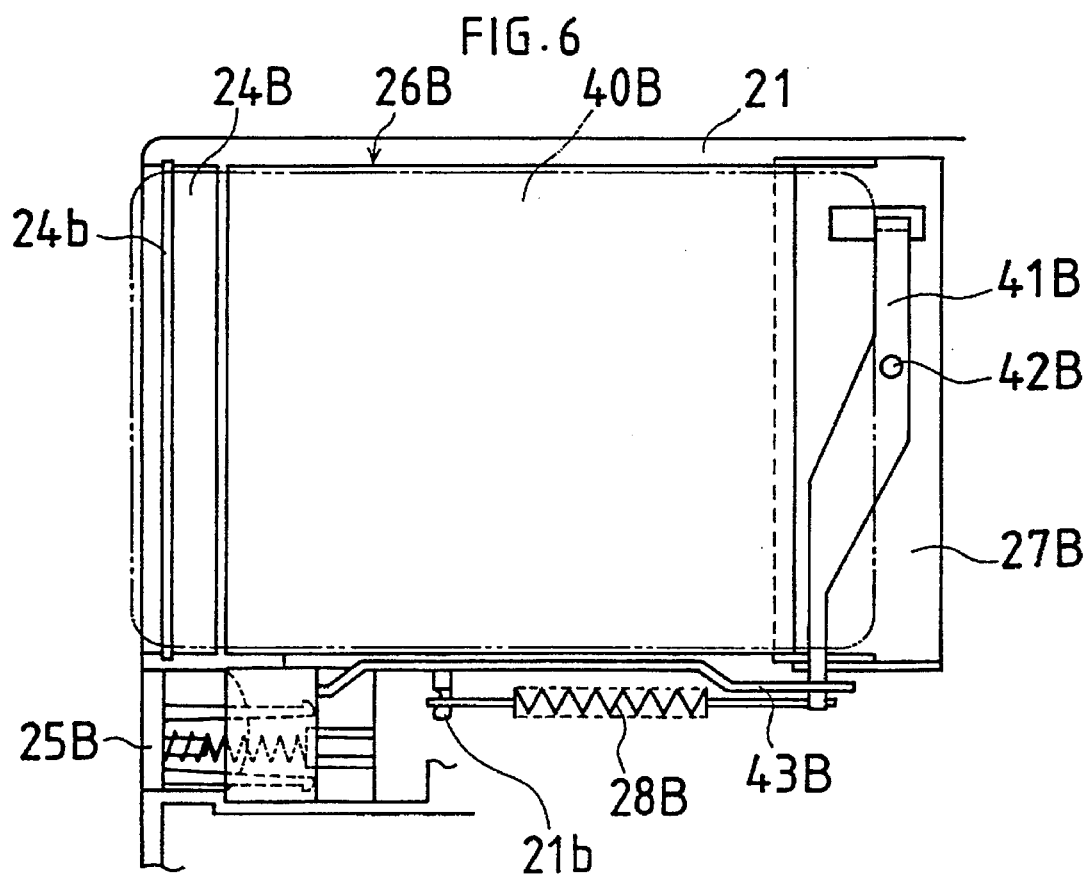
FIG. 6 is a plan view showing an ejecting mechanism for a second card slot.

The card receiving and ejecting device according to the present invention will be described with reference to FIGS. 5–8. As shown in FIGS. 5 and 6, the first and second doors 24A and 24B, which are vertically arranged adjacent to each other, are pivotally supported on axes 24a and 24b, respectively. As shown in FIG. 5, a first connector 27A is provided for electrically connecting the expansion card 40A, which is inserted into a first card slot 26A through the first door 24A, with the information processing equipment 10 at an innermost recess of the first card slot 26A. Similarly, as shown in FIG. 6, a second connector 27B is provided for electrically connecting the expansion card 40B, which is inserted into a second card slot 26B through the second door 24B, with the information processing equipment 10 at an innermost recess of the second card slot 26B.

A first ejection lever 41A for ejecting the expansion card 40A is pivotally supported by a pivot 42A, while a second ejection lever 41B for ejecting the expansion card 40B is pivotally supported by a pivot 42B. At the side of the first and second card slots 26A and 26B, first and second connecting rods 43A and 43B are disposed. Each one end of the first and second ejection levers 41A and 41B is inserted into a hole formed at each one end of the first and second connecting rods 3A and 43B. One end of a first ejection spring 28A is connected to the end of the first ejection lever 41A, which is projecting from the first connecting rod 43A, and the other end of the first ejection spring 28A is connected to engaging member 21a standing from the housing 21. Therefore, the first ejection lever 41A, the first connecting rod 43A and the first ejection button 25A are urged in a direction opposite to the pushing direction of the first ejection button 25A by the elasticity of the first ejection spring 28A. Likewise, one end of a second ejection spring 28B is connected to the end of the second ejection lever 41B, which is projecting from the first connecting rod 43A, and the other end of the second ejection spring 28B is connected to an engaging member 21b standing from the housing 21. Therefore, the second ejection lever 41B, the second connecting rod 43B and the second ejection button 25B are urged in a direction opposite to the pushing direction of the second ejection button 25B by the elasticity of the second ejection spring 28B.

Figure 7:
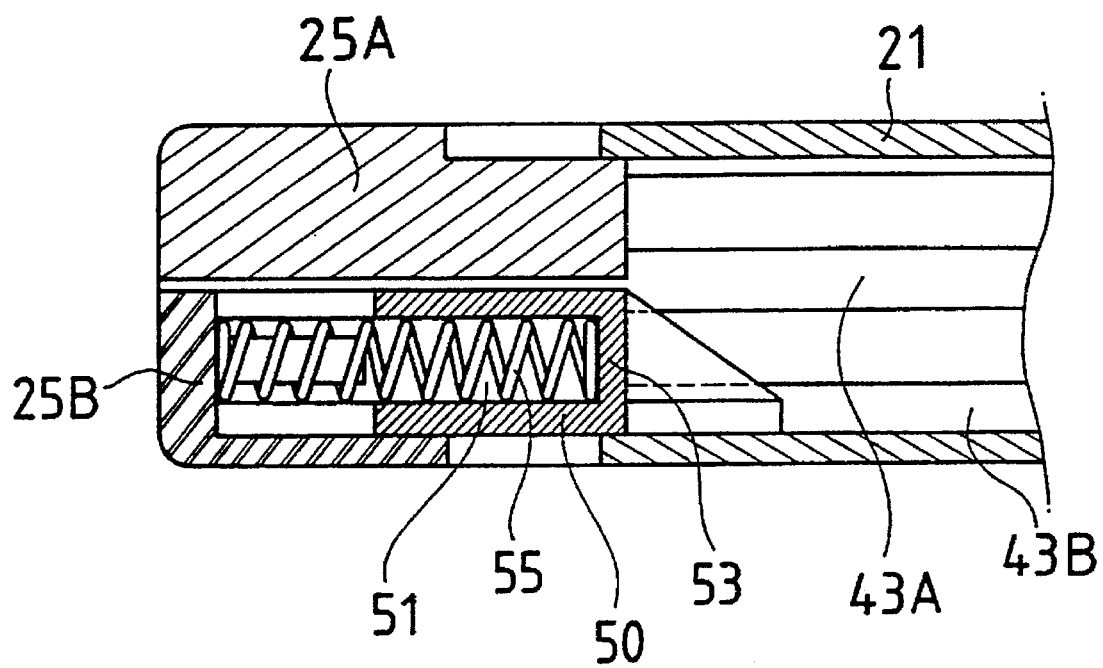
FIG. 7 is a vertical cross-sectional view of the ejecting mechanisms.
Figure 8:
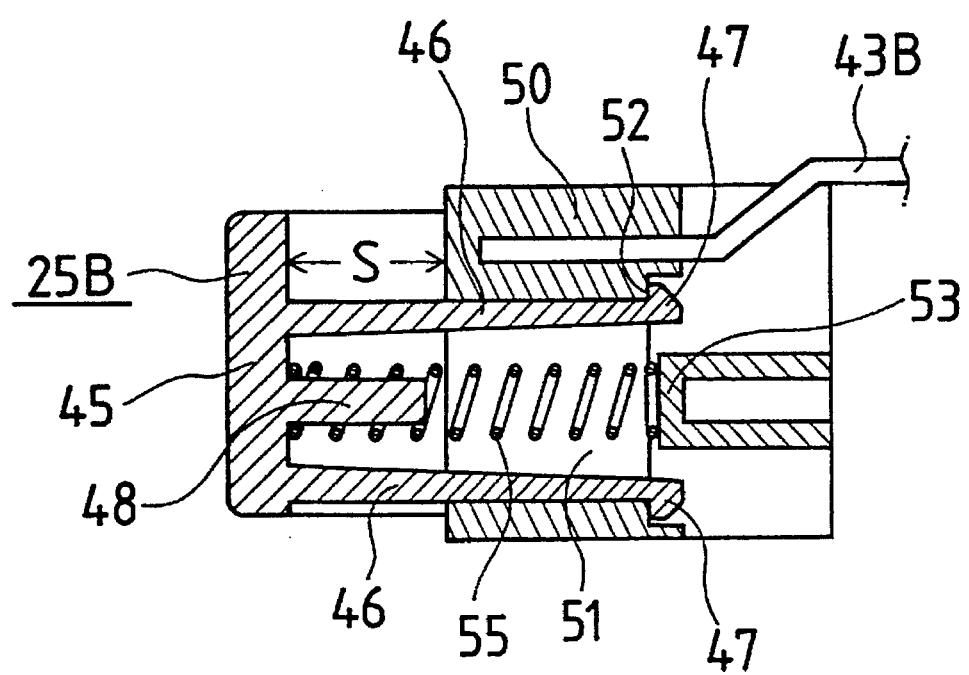
FIG. 8 is a horizontal cross-sectional view of the ejecting mechanism for the second card slot.
Figure 9:
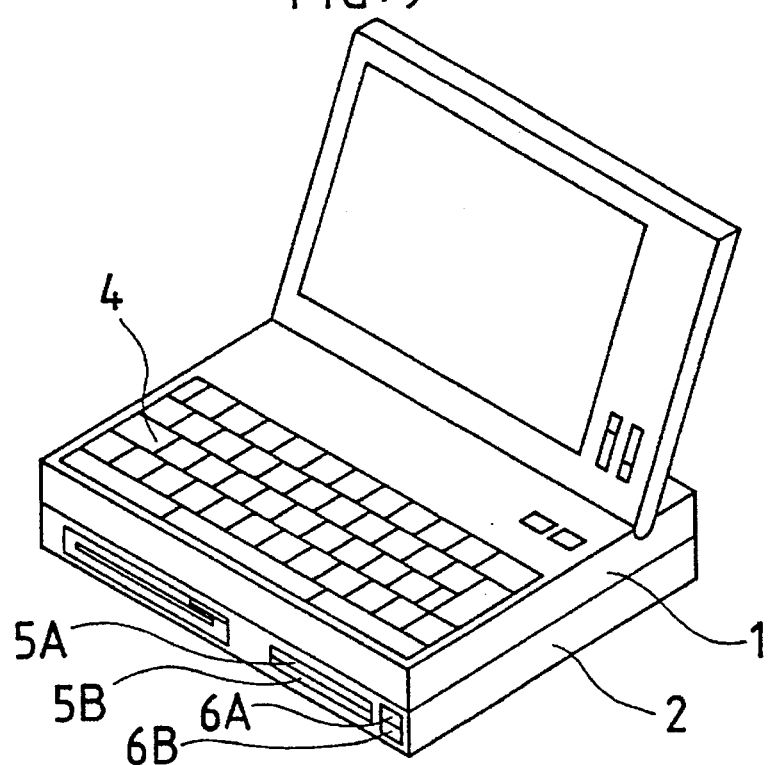
FIG. 9 is a perspective view showing an example of arrangement of an information processing equipment and an expansion unit.
Figure 10:
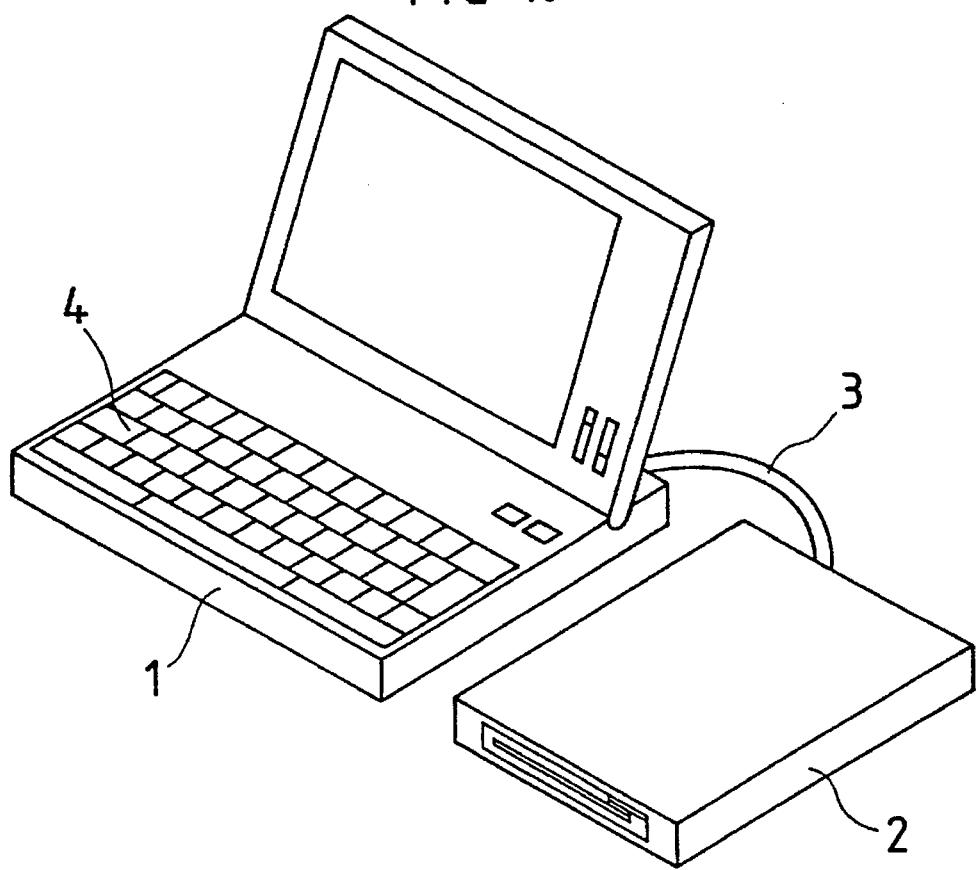
FIG. 10 is a perspective view showing another example of arrangement of an information processing equipment and an expansion unit.

As shown in FIGS. 5 and 7, the first ejection button 25A is directly connected to one end of the first connecting rod 43A. As shown in FIG. 8, the second ejection button 25B has a knob 45 and two extensions 46 extending from the knob 45. A stopper 47 is formed at each end of the extensions 46, and a mount 48 for spring is formed to project from the knob 45 between the stoppers 47. An ejection button guide 50 is fixed to one end of the second connecting rod 43B and has a horizontal hole 51 into which the extensions 46 are inserted. At one end of the horizontal hole 51, there is formed a stepped portion 52 to be engaged with the stoppers 47 of the second ejection button 25B. On the ejection button guide 50, a spring receiving member 53 is formed at a position opposite to the spring mount 48. An intervening spring 55 is mounted between the mount 48 of the second ejection button 25B and the spring receiving member 53 of the ejection button guide 50.

After the intervening spring 55 is attached to the mount 48 the stoppers 47 are inserted into the horizontal hole 51. Thereupon, the stoppers 47 slide along the inner wall of the hole 51, so that the extensions 46 enter into the horizontal hole 51 as they elastically deform inwardly. When the stoppers 47 arrive at the stepped portion 52, the extensions 46 elastically restore their form so that the stoppers 47 engage with the stepped portion 52. Thereby the second ejection button 25B is joined with the ejection button guide 50 and urged by the intervening spring 55 in a direction away from the ejection button guide 50 with the stoppers 47 caught by the stepped portion 52.

The intervening spring 55 has such a very small elasticity as to only return the second ejection button 25B to its home position in which the stoppers 47 are in engagement with the stepped portion 52 and not to move the ejection button guide 50 when the second ejection button 25B is pushed by a finger. A gap S is formed between an inner side of the knob 45 and a front side of the ejection button guide 50. The length of the gap S is set to be equal to the operation stroke of the first ejection button 25A.

Therefore, when the second ejection button 25B is pressed, the spring 55 is compressed to generate a pushing force. However, since the elasticity of the spring 55 is set very small, the ejection button guide 50 and the second connecting rod 43B will not be moved until the knob 45 of the second ejection button 25B is brought into contact with the ejection button guide 50. Thus, when the second ejection button 25B is pressed simultaneously with the first ejection button 25A, firstly the ejecting action by the first ejection button 25A starts, and upon completion of the ejecting action of the first ejection button 25A, the ejecting action of the second ejection button 25B starts. Accordingly, when an user presses the second ejection button 25B together with the first ejection button 25A although he or she intends to press only the first ejection button 25A, the malfunction of the second ejection button 25B is prevented.

As mentioned above, when the first ejection button 25A is pressed, the first connecting rod 43A is operated to rotate the first ejection lever 41B counterclockwise, so that the expansion card 40A is pushed outside. When pressing the second ejection button 25B, only the second ejection button 25B can be easily pressed by lifting the expansion unit 20 together with the information processing equipment 10. When the second ejection button 25B is pressed, the knob 45 of the second ejection button 25B is brought into contact with the ejection button guide 50, and then the second connecting rod 43B is operated to rotate the second ejection lever 41B counterclockwise, so that the expansion card 40B is pushed outside.

Although the description has been made with respect to the expansion unit for receiving an external magnetic storage medium or an expanded function card in the above embodiment, the invention can be widely applied to the other peripheral devices. Further, the invention is not restrictively applied to the wedge-shaped expansion unit, but can be applied to the conventional peripheral device of box-type.

What is claimed is:

1. A card receiving/ejecting device for receiving and ejecting first and second expansion cards in an information processing equipment, comprising:

a first card receiving/ejecting unit having a first card slot for accepting the first expansion card, and a first card ejecting mechanism for ejecting the first expansion card from said first card slot, said first card slot having at an innermost recess thereof a first connector for electrically connecting the first expansion card with said information processing equipment, and said first card ejecting mechanism having a first ejection lever for removing the first expansion card from said first connector, a first ejection button for operating said first ejection lever, a first connecting rod for operatively connecting said first ejection lever with said first ejection button, and a first ejection spring for elastically urging said first ejection lever in a direction opposite to a pushing direction of said first ejection button;

a second card receiving/ejecting unit having a second card slot for accepting the second expansion card, and a second card ejecting mechanism for ejecting the second expansion card from said second card slot, said second card slot having at an innermost recess thereof a second connector for electrically connecting the second expansion card with said information processing equipment, and said second card ejecting mechanism having a second ejection lever for removing the second expansion card from said second connector, a second ejection button for operating said second ejection lever, a second connecting rod for operatively connecting said second ejection lever with said second ejection button, and a second ejection spring for elastically urging said second ejection lever in a direction opposite to a pushing direction of said second ejection button; and a housing having an opening, through which the first and second expansion cards are inserted, for accommodating said first and second receiving/ejecting units, wherein said first and second receiving/ejecting units are vertically arranged adjacent to each other, said first and second ejection buttons are vertically arranged adjacent to each other at the side of said opening of said housing, said first ejection button is directly connected to said first connecting rod, and said second ejection button is connected to said second connecting rod via an intervening spring having a smaller elasticity than that of said second ejection spring.

2. A card receiving/ejecting device according to claim 1, wherein said intervening spring comprises a coil spring.

3. A card receiving/ejecting device according to claim 1, wherein said first ejection button has a first operational stroke and the second ejection button has a second operational stroke that does not begin until completion of the first operational stroke upon simultaneously depressing said first and second ejection buttons, so that upon simultaneously depressing the first and second ejection buttons the first expansion card is ejected from the first card receiving/ejection unit when the first operational stroke is completed, and the second expansion card is ejected from the second card receiving/ejecting unit when the second operational stroke is completed.

4. A card receiving/ejecting device according to claim 3, wherein said intervening spring comprises a coil spring.

5. The card receiving/ejection device according to claim 1, wherein the second ejection button is connected to said second connecting rod via an ejection button guide, the intervening spring and a knob, so that the ejection button guide and the second connecting rod will not be moved until the knob is brought into contact with the ejection button guide.

* * * * *